(12) United States Patent
Sasaki et al.

(10) Patent No.: US 11,266,018 B2
(45) Date of Patent: Mar. 1, 2022

(54) PRINTED WIRING BOARD AND METHOD FOR MANUFACTURING THE SAME

(71) Applicant: Mitsubishi Electric Corporation, Tokyo (JP)

(72) Inventors: Shunsuke Sasaki, Tokyo (JP); Yusuke Morimoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 3 days.

(21) Appl. No.: 16/652,849

(22) PCT Filed: Dec. 4, 2018

(86) PCT No.: PCT/JP2018/044603
§ 371 (c)(1),
(2) Date: Apr. 1, 2020

(87) PCT Pub. No.: WO2019/111906
PCT Pub. Date: Jun. 13, 2019

(65) Prior Publication Data
US 2020/0236786 A1 Jul. 23, 2020

(30) Foreign Application Priority Data
Dec. 8, 2017 (JP) .............................. JP2017-235804

(51) Int. Cl.
*H05K 1/14* (2006.01)
*H05K 1/11* (2006.01)
(Continued)

(52) U.S. Cl.
CPC ............. *H05K 1/141* (2013.01); *H05K 1/111* (2013.01); *H05K 3/34* (2013.01); *H05K 3/366* (2013.01); *H05K 2201/0302* (2013.01)

(58) Field of Classification Search
CPC ... H05K 1/11; H05K 1/14; H05K 1/18; H05K 1/181–1/187; H05K 3/30; H05K 3/34;
(Continued)

(56) References Cited

U.S. PATENT DOCUMENTS

| 5,455,742 A | * | 10/1995 | Phoy ...................... H05K 3/366 174/250 |
| 5,754,411 A | * | 5/1998 | Woychik ................ H05K 3/366 361/784 |

(Continued)

FOREIGN PATENT DOCUMENTS

| JP | 2008198814 A | * | 8/2008 | ............... H05K 1/14 |
| JP | 4314809 B2 | | 8/2009 | |

(Continued)

OTHER PUBLICATIONS

International Search Report (PCT/ISA/210) dated Feb. 12, 2019, by the Japan Patent Office as the International Searching Authority for International Application No. PCT/JP2018/044603.
(Continued)

*Primary Examiner* — Tuan T Dinh
(74) *Attorney, Agent, or Firm* — Buchanan Ingersoll & Rooney PC

(57) ABSTRACT

A printed wiring board includes a main substrate, a standing substrate, a first electrode portion, and a second electrode portion. The second electrode portion is connected to the first electrode portion with solder while a support portion is inserted in a slit. The first electrode portion is provided to reach the slit. The second electrode portion is disposed to span from a bottom surface to a height position higher than or equal to a midpoint between a top surface and the bottom surface.

8 Claims, 16 Drawing Sheets

(51) Int. Cl.
*H05K 3/34* (2006.01)
*H05K 3/36* (2006.01)

(58) Field of Classification Search
CPC .... H05K 3/36; H05K 9/00; H05K 2201/0305; H05K 2201/0367; H01R 17/00; H01R 17/16
USPC .......... 361/767, 772–778, 792, 803; 174/250–258; 439/63–65; 29/830–832, 29/842–846
See application file for complete search history.

(56) References Cited

U.S. PATENT DOCUMENTS

| | | | |
|---|---|---|---|
| 6,496,384 B1* | 12/2002 | Morales | H05K 3/366 29/830 |
| 7,273,379 B2* | 9/2007 | Jang | H05K 3/366 439/65 |
| 2006/0049777 A1 | 3/2006 | Kumagai et al. | |
| 2006/0070768 A1* | 4/2006 | Lee | H05K 3/366 174/250 |
| 2006/0220636 A1* | 10/2006 | Satoh | H05K 1/141 310/321 |
| 2011/0149543 A1* | 6/2011 | Kamoi | H05K 3/366 361/803 |
| 2012/0212920 A1* | 8/2012 | Schreffler | H01R 12/737 361/803 |
| 2016/0330342 A1 | 11/2016 | Kinoshita et al. | |
| 2019/0380202 A1 | 12/2019 | Sasaki et al. | |

FOREIGN PATENT DOCUMENTS

| | | |
|---|---|---|
| JP | 2017017089 A | 1/2017 |
| JP | 2017208381 A | 11/2017 |
| WO | 2015093112 A1 | 6/2015 |
| WO | 2017002720 A1 | 1/2017 |
| WO | 2018159004 A1 | 9/2018 |

OTHER PUBLICATIONS

Written Opinion (PCT/ISA/237) dated Feb. 12, 2019, by the Japan Patent Office as the International Searching Authority for International Application No. PCT/JP2018/044603.

* cited by examiner

PRINTED WIRING BOARD AND METHOD FOR MANUFACTURING THE SAME

TECHNICAL FIELD

The present invention relates to a printed wiring board and a method for manufacturing the same, and more particularly to a printed wiring board including a main substrate and a standing substrate and a method for manufacturing the same.

BACKGROUND ART

An electronic device having a standing substrate attached to a main substrate is described, for example, in Japanese Patent No. 4314809 (PTL 1). In this electronic device, an auxiliary substrate (standing substrate) is inserted in a slit provided in a mother substrate (main substrate), and terminal pads (electrodes) of the standing substrate are soldered to terminal pads (electrodes) of the main substrate.

CITATION LIST

Patent Literature

PTL 1: Japanese Patent No. 4314809

SUMMARY OF INVENTION

Technical Problem

In the electronic device described in the above publication, there is a gap between the slit provided in the main substrate and the terminal pads (electrodes) of the main substrate. Thus, when the terminal pads (electrodes) of the main substrate are immersed in jet stream solder in a flow soldering process, only a small amount of solder adheres to the terminal pads (electrodes) of the main substrate. This results in a smaller volume of a fillet forming a solder joint portion, causing a rupture of the solder joint portion to occur in a short time.

The present invention has been made in view of the above-described problem, and an object of the present invention is to provide a printed wiring board capable of suppressing the occurrence of a rupture of a solder joint portion in a short time and a method for manufacturing the same.

Solution to Problem

A printed wiring board of the present invention includes a main substrate, a first electrode portion, a standing substrate, and a second electrode portion. The main substrate has a top surface and a bottom surface facing the top surface, and has a slit extending from the top surface to the bottom surface in a direction in which the top surface and the bottom surface face each other. The first electrode portion is provided on the bottom surface of the main substrate. The standing substrate has a support portion inserted in the slit. The second electrode portion is provided on the support portion of the standing substrate. The second electrode portion is connected to the first electrode portion with solder while the support portion is inserted in the slit. The first electrode portion is provided to reach the slit.

Advantageous Effects of Invention

According to the printed wiring board of the present invention, the first electrode portion is provided to reach the slit. Thus, the amount of solder for a solder joint portion formed on the first electrode portion can be increased, as compared to an example where there is a gap between the first electrode portion and the slit. As a result, the occurrence of a rupture of the solder joint portion in a short time can be suppressed.

DESCRIPTION OF EMBODIMENTS

Embodiments of the present invention are hereinafter described with reference to the drawings.

First Embodiment

Figure 1:
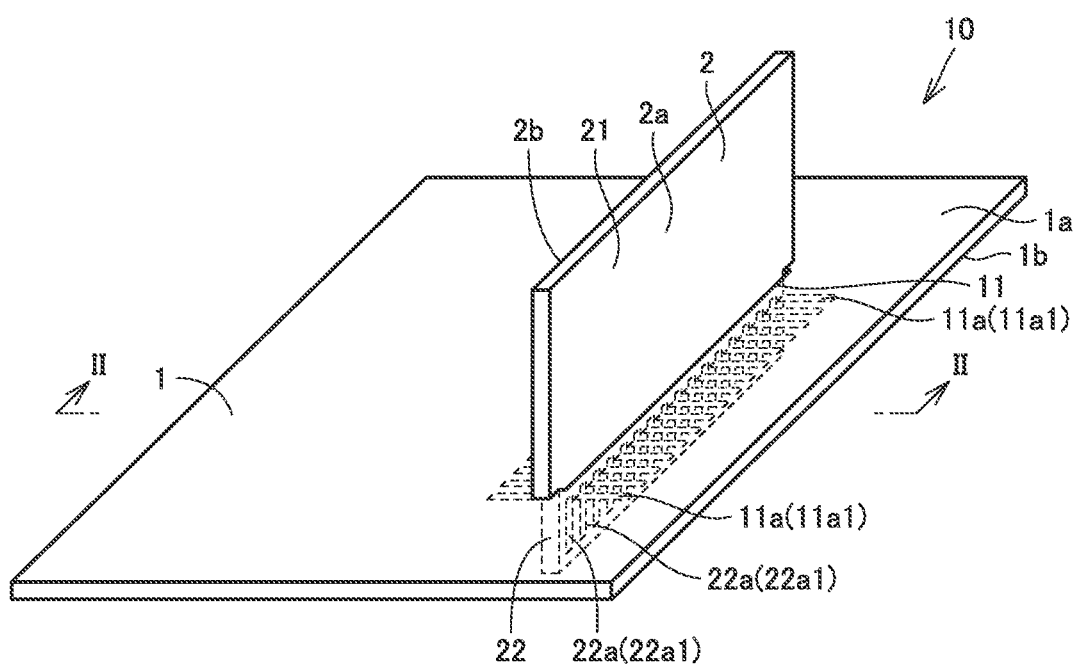
FIG. 1 is a perspective view schematically showing a configuration in which a standing substrate has been mounted on a main substrate in a first embodiment of the present invention.
Figure 2:
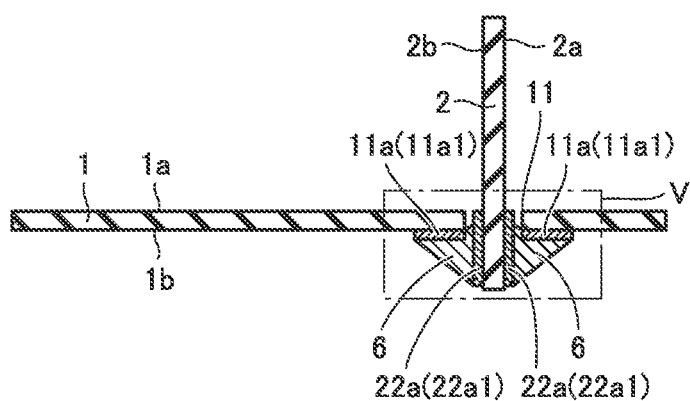
FIG. 2 is a cross-sectional view along the line II-II in FIG. 1.
Figure 3:
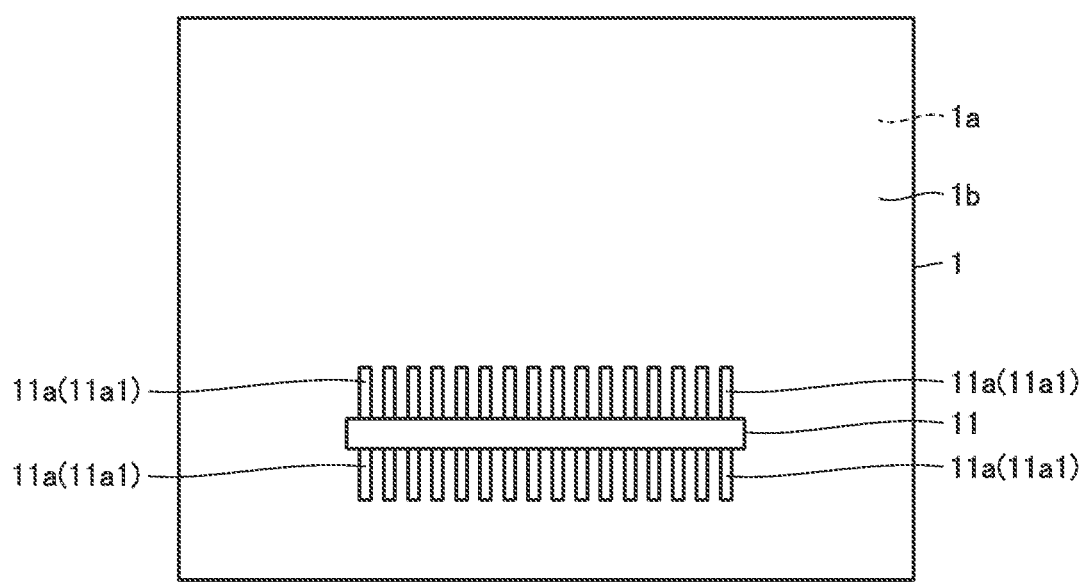
FIG. 3 is a bottom view schematically showing the configuration of the main substrate in the first embodiment of the present invention.
Figure 4:
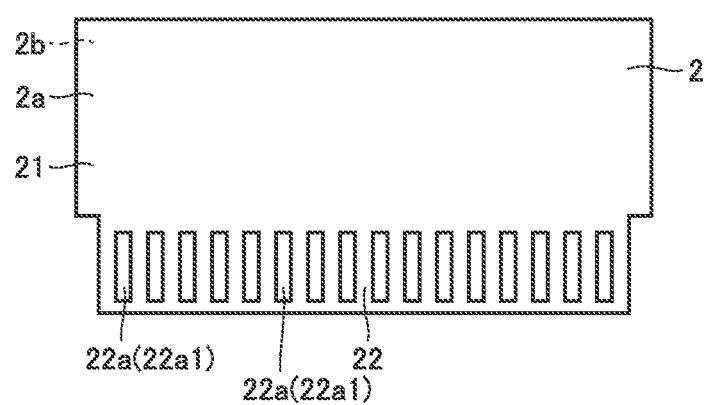
FIG. 4 is a front view schematically showing the configuration of the standing substrate in the first embodiment of the present invention.
Figure 5:
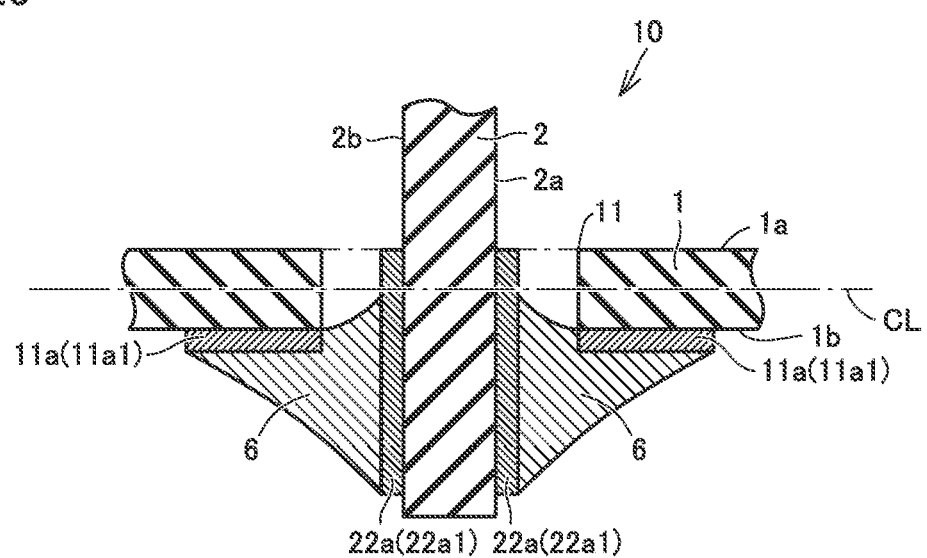
FIG. 5 is an enlarged view showing a portion V in FIG. 2 in an enlarged manner.

The configuration of a printed wiring board 10 in a first embodiment of the present invention is described with reference to FIGS. 1 to 5. Printed wiring board 10 in the present embodiment is a three-dimensional printed wiring board. FIG. 1 is a perspective view showing printed wiring board 10 in the present embodiment. FIG. 2 is a cross-sectional view showing a standing substrate 2 that has been mounted on a main substrate 1. FIG. 3 is a bottom view showing a bottom surface 1*b* of main substrate 1. FIG. 4 is a front view showing a front surface 2*a* of standing substrate 2. FIG. 5 is a cross-sectional view showing a solder joint portion formed to span a first electrode portion 11*a* of main substrate 1 and a second electrode portion 22*a* of standing substrate 2.

As shown in FIGS. 1 and 2, printed wiring board 10 in the present embodiment includes main substrate 1, standing substrate 2, first electrode portion 11*a*, and second electrode portion 22*a*. Main substrate 1 has a top surface 1*a*, bottom surface 1*b*, and a slit 11. Bottom surface 1*b* faces top surface 1*a*. The direction in which top surface 1*a* and bottom surface 1*b* face each other is a thickness direction of main substrate 1.

As shown in FIGS. 2 and 3, main substrate 1 has slit 11. Slit 11 extends from top surface 1*a* to bottom surface 1*b* of main substrate 1 in the direction in which top surface 1*a* and bottom surface 1*b* face each other. Slit 11 is provided at a position corresponding to a support portion 22 of standing substrate 2.

Main substrate 1 is made of a common printed wiring board material. Specifically, main substrate 1 is made of, for example, CEM-3 (Composite epoxy material-3), which is a laminate produced by using a glass nonwoven fabric impregnated with a fire-resistant epoxy resin for a core of a base material, and using a prepreg formed of a glass fabric and an epoxy resin for surfaces to provide reinforced strength.

As shown in FIGS. 1 and 2, standing substrate 2 is connected to main substrate 1 so as to stand from top surface 1*a* of main substrate 1. Standing substrate 2 has front surface 2*a*, a rear surface 2*b*, a body portion 21, and support portion 22. Rear surface 2*b* faces front surface 2*a*. The direction in which front surface 2*a* and rear surface 2*b* face each other is a thickness direction of standing substrate 2. Body portion 21 is connected to support portion 22. Support portion 22 is provided at a lower portion of standing substrate 2 so as to protrude downward from body portion 21. Support portion 22 is inserted in slit 11.

In the direction in which front surface 2*a* and rear surface 2*b* of standing substrate 2 face each other, slit 11 has a width greater than the thickness of support portion 22. In the direction in which front surface 2*a* and rear surface 2*b* of standing substrate 2 face each other, support portion 22 is arranged to be spaced from an inner peripheral surface of slit 11. Support portion 22 may be arranged to be spaced from slit 11 along the entire inner peripheral surface of slit 11.

As shown in FIGS. 1 and 4, body portion 21 protrudes on one side and the other side of support portion 22. Body portion 21 protrudes on both sides in a longitudinal direction of support portion 22. Body portion 21 protrudes on both sides of slit 11 in a longitudinal direction of slit 11. Electronic components are mounted on body portion 21. These electronic components are, for example, a power semiconductor device, a transformer, and the like.

Standing substrate 2 is made of a common printed wiring board material. Specifically, standing substrate 2 is made of, for example, CEM-3, which is a laminate produced by using a glass nonwoven fabric impregnated with a fire-resistant epoxy resin for a core of a base material, and using a prepreg formed of a glass fabric and an epoxy resin for surfaces to provide reinforced strength.

As shown in FIGS. 2 and 3, first electrode portion 11*a* is provided on bottom surface 1*b* of main substrate 1. First electrode portion 11*a* is provided to reach slit 11. That is, first electrode portion 11*a* has an end disposed to overlap the edge of slit 11. In the present embodiment, first electrode portion 11*a* has a plurality of first electrodes 11*a*1. The plurality of first electrodes 11*a*1 of first electrode portion 11*a* are arranged at regular intervals in the longitudinal direction of slit 11. Each of the plurality of first electrodes 11*a*1 is arranged with slit 11 interposed therein in a short direction of slit 11. That is, each of the plurality of first electrodes 11*a*1 is arranged on both one side and the other side in the short direction of slit 11.

As shown in FIGS. 2 and 4, second electrode portion 22*a* is provided on support portion 22 of standing substrate 2. Second electrode portion 22*a* is electrically connected to first electrode portion 11*a* with solder 6. In the present embodiment, second electrode portion 22*a* has a plurality of second electrodes 22*a*1. The plurality of second electrodes 22*a*1 of second electrode portion 22*a* are arranged at regular intervals in the longitudinal direction of support portion 22.

As shown in FIGS. 1 and 2, second electrode portion 22*a* is disposed at a position corresponding to first electrode portion 11*a*. Each of the plurality of second electrodes 22*a*1 is disposed at a position corresponding to each of the plurality of first electrodes 11*a*1. Each of the plurality of second electrodes 22*a*1 is provided on both front surface 2*a* and rear surface 2*b* of standing substrate 2.

Second electrode portion 22*a* is connected to first electrode portion 11*a* with solder 6 while support portion 22 is inserted in slit 11. In the present embodiment, each the plurality of second electrodes 22*a*1 is connected to each of the plurality of first electrodes 11*a*1 with solder 6. The soldering of second electrode portion 22*a* to first electrode portion 11*a* causes electrical connection between standing substrate 2 and main substrate 1.

As shown in FIG. 5, second electrode portion 22*a* is disposed to span from bottom surface 1*b* of main substrate 1 to a height position higher than or equal to a midpoint CL between top surface 1*a* and bottom surface 1*b*. When standing substrate 2 is attached to main substrate 1, second electrode portion 22*a* has a length reaching a height position higher than or equal to half the thickness of main substrate 1. In the present embodiment, second electrode portion 22*a* extends to a height position closer to top surface 1*a* than midpoint CL of main substrate 1. Specifically, second electrode portion 22*a* extends to a height position of top surface 1*a* of main substrate 1. That is, as indicated by a chain-dotted line in FIG. 5, second electrode portion 22*a* has an upper end disposed to be flush with top surface 1*a* of main substrate 1. In addition, since slit 11 has a width greater than the thickness of support portion 22 as will be described later, front surface 2*a* and rear surface 2*b* of standing substrate 2 are arranged in slit 11 to be slightly spaced from the ends of the slit. This allows the solder to wet up into the slit in the soldering step. A distance of the space is desirably more than or equal to 50 μm and less than or equal to 190 It was experimentally found that it is difficult to perform flow soldering if the distance is more than 200 for example. Further, a slit-side end surface of each of the plurality of first electrodes 11a1 is covered with solder 6.

Next, a method for manufacturing the printed wiring board in the present embodiment is described.

Figure 6:
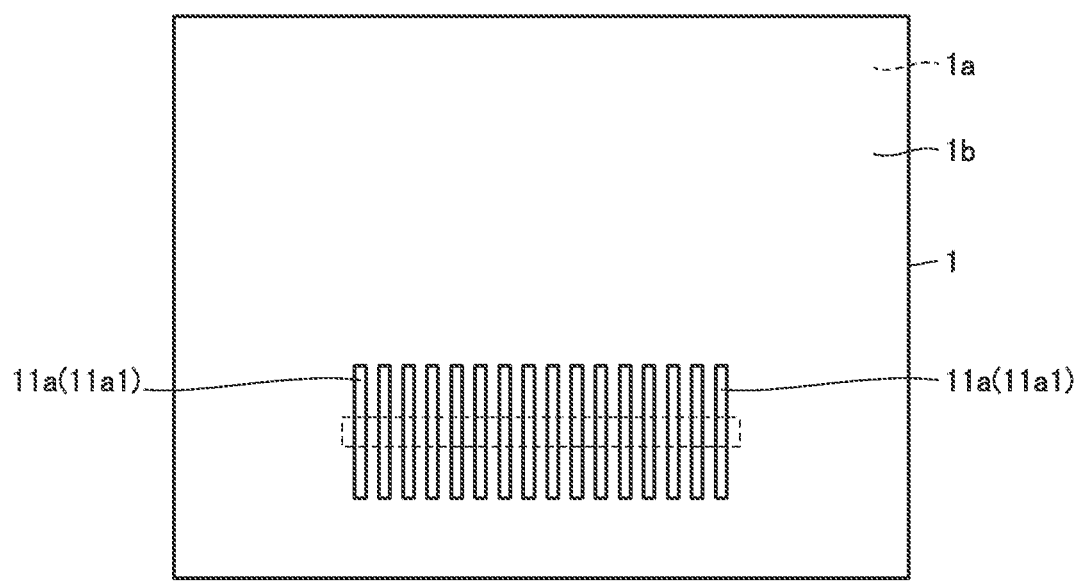
FIG. 6 is a bottom view schematically showing the main substrate that has been provided with a first electrode portion in a method for manufacturing a printed wiring board in the first embodiment of the present invention.

Referring to FIG. 6, main substrate 1 is prepared. Main substrate 1 has top surface 1a, and bottom surface 1b facing top surface 1a. First electrode portion 11a is provided on bottom surface 1b of main substrate 1. In FIG. 6, a portion to be described later where slit 11 is intended to be formed is indicated by a dashed line. First electrode portion 11a is provided to straddle the portion indicated by the dashed line where slit 11 is to be formed.

Next, as shown in FIGS. 6 and 3, slit 11 is formed in main substrate 1 in such a manner that first electrode portion 11a is partially cut out. That is, slit 11 is formed in a portion of a region where first electrode portion 11a overlaps main substrate 1. Thus, first electrode portion 11a is formed to reach slit 11. Slit 11 extends from top surface 1a to bottom surface 1b.

In the present embodiment, in a direction intersecting the direction in which the plurality of first electrodes 11a1 are arranged, slit 11 is formed at the center of first electrode portion 11a. In the direction intersecting the direction in which the plurality of first electrodes 11a1 are arranged, slit 11 may be formed at one end or the other end of first electrode portion 11a.

Slit 11 may be provided by press working using a metal mold. Specifically, slit 11 may be formed by punching main substrate 1 and first electrode portion 11a together in press working.

Figure 7:
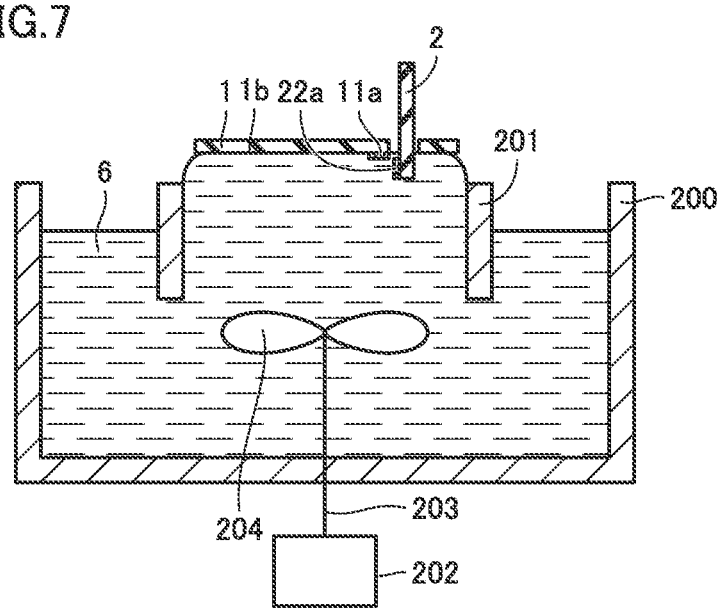
FIG. 7 is a cross-sectional view schematically showing the first electrode portion and a second electrode portion being soldered to each other by a flow soldering process in the method for manufacturing the printed wiring board in the first embodiment of the present invention.

Next, as shown in FIG. 4, standing substrate 2 having support portion 22 to be inserted in slit 11 is prepared. Second electrode portion 22a is provided on support portion 22. Next, referring to FIG. 7, support portion 22 of standing substrate 2 is inserted in slit 11. Support portion 22 may be vertically inserted in slit 11. After support portion 22 of standing substrate 2 has been inserted in slit 11, second electrode portion 22a is connected to first electrode portion 11a with solder 6.

First electrode portion 11a of main substrate 1 and second electrode portion 22a of standing substrate 2 are soldered to each other by a flow soldering process. In the flow soldering process, printed wiring board 10 is transferred by a conveyor while standing substrate 2 is attached to main substrate 1. First electrode portion 11a of main substrate 1 and second electrode portion 22a of standing substrate 2 are immersed in a molten solder jet stream and soldered to each other. As a result, a solder joint portion is formed between first electrode portion 11a and second electrode portion 22a. First electrode portion 11a and second electrode portion 22a are fixed to each other by the solder joint portion.

Specifically, molten solder 6 stored in a solder bath 200 jets upward from a flow soldering nozzle 201, as a driving force of a motor 202 is transmitted to a propeller 204 via a motor shaft 203 and rotates propeller 204. As printed wiring board 10 is transferred by the conveyor, bottom surface 1b of main substrate 1 is disposed above flow soldering nozzle 201. Thus, bottom surface 1b of main substrate 1 is immersed in the jet stream solder. As a result, first electrode portion 11a and second electrode portion 22a are solder joined to each other. In the present embodiment, each of the plurality of second electrodes 22a1 is soldered to each of the plurality of first electrodes 11a1 and the entire electrodes exposed at slit 11 are covered with solder, and moreover, the solder is continuously formed up to a fillet on the second electrode portion in the slit.

Next, the function and effect of the present embodiment are described as compared to a comparative example.

Figure 8:
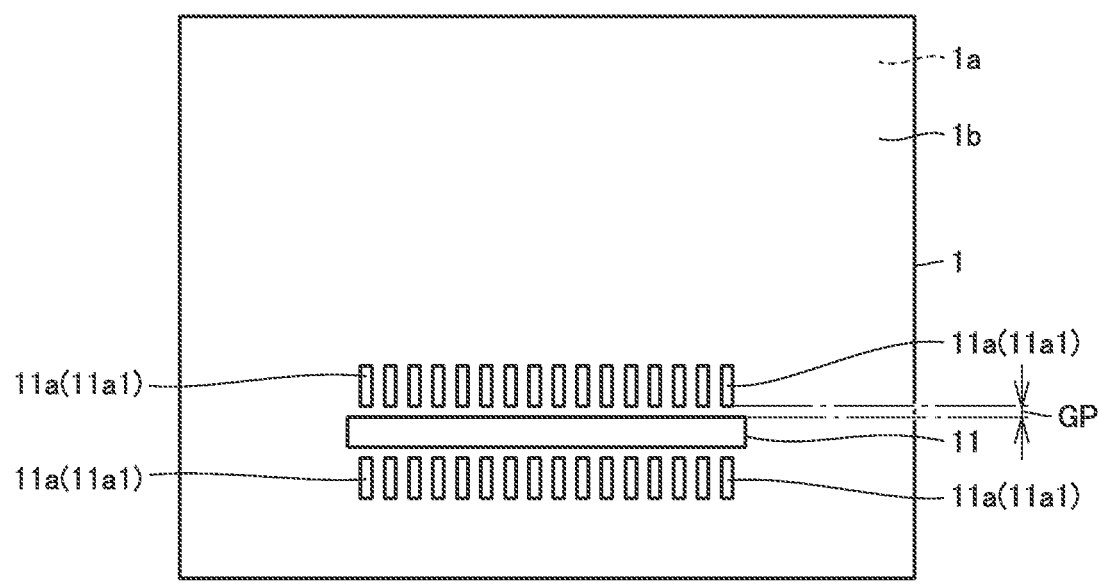
FIG. 8 is a bottom view schematically showing the configuration of the main substrate in a comparative example.
Figure 9:
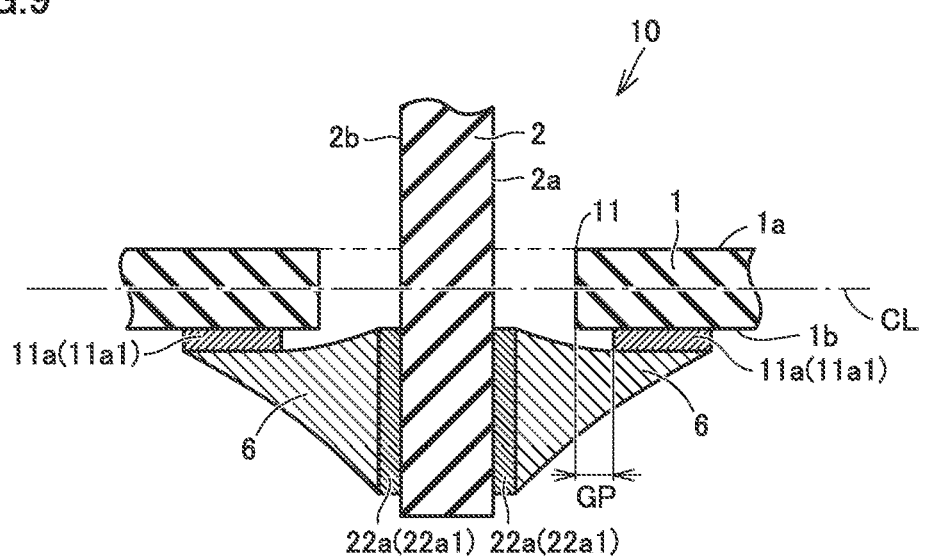
FIG. 9 is a cross-sectional view schematically showing the configuration of a solder joint portion connecting the first electrode portion of the main substrate and the second electrode portion of the standing substrate in the comparative example.

Printed wiring board 10 in the comparative example is described with reference to FIGS. 8 and 9. FIG. 8 shows a portion corresponding to FIG. 3. FIG. 9 shows a portion corresponding to FIG. 5. As shown in FIG. 8, printed wiring board 10 in the comparative example is different from printed wiring board 10 in the present embodiment in that first electrode portion 11a is not provided to reach slit 11. That is, as shown in FIG. 9, there is a gap GP between first electrode portion 11a and slit 11 in printed wiring board 10 in the comparative example. Also in printed wiring board 10 in the comparative example, first electrode portion 11a and second electrode portion 22a are soldered to each other by a flow soldering process, as in printed wiring board 10 in the present embodiment.

In the flow soldering process, printed wiring board 10 is transferred to solder bath 200 by the conveyor. During this process, printed wiring board 10 is immersed in molten solder 6 from its front end in the transfer direction, causing first electrode portion 11a and second electrode portion 22a to be solder joined to each other. As a result, a solder joint portion is formed between first electrode portion 11a and second electrode portion 22a. The volume of a fillet forming the solder joint portion is determined by the amount of solder adhering to first electrode portion 11a and second electrode portion 22a. The amount of solder is determined by relation between surface tension on first electrode portion 11a and second electrode portion 22a, and gravity. The amount of solder increases as the surface tension increases.

That is, as the amount of electrode exposure (surface area) of first electrode portion 11a and second electrode portion 22a increases, the surface tension on first electrode portion 11a and second electrode portion 22a increases. Thus, a higher amount of solder can adhere to first electrode portion 11a and second electrode portion 22a. Thus, the fillet forming the solder joint portion can have a larger volume.

As the amount of electrode exposure (surface area) of first electrode portion 11a and second electrode portion 22a decreases, on the other hand, the surface tension on first electrode portion 11a and second electrode portion 22a decreases. Thus, only a small amount of solder can adhere to first electrode portion 11a and second electrode portion 22a. Thus, the fillet forming the solder joint portion has a smaller volume. There is also a risk that the solder could fall from first electrode portion 11a and second electrode portion 22a when they leave the jet stream solder, resulting in unsoldered first electrode portion 11a and second electrode portion 22a.

When printed wiring board 10 is incorporated into a product after the soldering has been completed, and is exposed to a temperature cycle under a usage environment after operation, thermal stress is generated in the solder joint portion due to a difference in coefficient of thermal expansion between standing substrate 2 and main substrate 1. This thermal stress is repeatedly applied to the solder joint portion. This thermal stress causes thermal distortion to occur in the solder joint portion, ultimately resulting in a fatigue failure of the solder joint portion. When the fillet forming the solder joint portion between standing substrate 2 and main substrate 1 has a larger volume, mechanical strength is improved as compared to when the fillet has a smaller volume, and therefore, the time before the occurrence of a fatigue failure (rupture) of the solder joint portion is extended.

In printed wiring board 10 in the comparative example, the amount of electrode exposure of first electrode portion 11a decreases due to the existence of gap GP between first electrode portion 11a and slit 11, as shown in FIG. 9. The surface tension on first electrode portion 11a thus decreases, and therefore, only a small amount of solder can adhere to first electrode portion 11a when first electrode portion 11a leaves the jet stream solder. Thus, the fillet forming the solder joint portion has a smaller volume. Thus, when the printed wiring board is exposed to the temperature cycle under the usage environment after operation, there is a risk that a fatigue failure of the solder joint portion could occur in a short time.

In contrast, according to printed wiring board 10 in the present embodiment, first electrode portion 11a is provided to reach slit 11. In printed wiring board 10 in the present embodiment, therefore, a larger amount of the surface of first electrode portion 11a can be exposed than in printed wiring board 10 in the comparative example, to increase the surface tension on first electrode portion 11a. Thus, a higher amount of solder can adhere to first electrode portion 11a, thus allowing the fillet forming the solder joint portion to have a larger volume. In this manner, as compared to the case where there is a gap between first electrode portion 11a and slit 11 as in printed wiring board 10 in the comparative example, the amount of solder for the solder joint portion formed on first electrode portion 11a can be increased. As a result, when the printed wiring board is exposed to the temperature cycle under the usage environment after operation, the time before the occurrence of a fatigue failure (rupture) of the solder joint portion can be extended. Printed wiring board 10 ensuring high reliability can thus be obtained.

In addition, according to printed wiring board 10 in the present embodiment, second electrode portion 22a is disposed to span from bottom surface 1b of main substrate 1 to the height position higher than or equal to midpoint CL between top surface 1a and bottom surface 1b. Thus, as compared to the case where second electrode portion 22a is disposed to span from bottom surface 1b of main substrate 1 to a height position lower than midpoint CL, the amount of solder for the solder joint portion between first electrode portion 11a and second electrode portion 22a can be increased.

Next, the function and effect of the present embodiment are described as compared to PTL 1 described above.

In the electronic device described in PTL 1, the slit provided in the mother substrate (main substrate) includes an area of a first slit width and an area of a second slit width. In the area of the first slit width, there are provided the terminal pads (electrodes) for connecting to the auxiliary substrate (standing substrate) with solder. The area of the second slit width serves to vertically hold the auxiliary substrate (standing substrate) with respect to the mother substrate (main substrate) until soldering is completed after the insertion of the auxiliary substrate (standing substrate) in the slit. The first slid width is greater than the second slid width. The second slid width is smaller than or equal to the thickness of the auxiliary substrate (standing substrate). Thus, it is difficult to insert the auxiliary substrate (standing substrate) in the slit before flow soldering. It is more difficult to insert the auxiliary substrate (standing substrate) in the slit, particularly when the auxiliary substrate (standing substrate) is warped in the thickness direction due to application of thermal history during a mounting step. Therefore, there is a risk of damage to the auxiliary substrate (standing substrate) or the terminal pads (electrodes) at the area of the second slit width during the insertion of the auxiliary substrate (standing substrate) in the slit.

In contrast, according to printed wiring board 10 in the present embodiment, in the direction in which front surface 2a and rear surface 2b of standing substrate 2 face each other, slit 11 has a width greater than the thickness of support portion 22. It should be noted that the width of slit 11 suitably has a maximum dimension obtained by adding 0.35 mm to the thickness of support portion 22. Accordingly, during the insertion of standing substrate 2 in slit 11 before flow soldering, support portion 22 can be smoothly inserted in slit 11. In particular, support portion 22 can be smoothly inserted in slit 11 even if standing substrate 2 is warped in the thickness direction. Therefore, damage to standing substrate 2, first electrode portion 11a or second electrode portion 22a can be suppressed during the insertion of standing substrate 2 in slit 11. Thus, printed wiring board 10 having good workability and improved quality can be obtained.

Next, variations of the present embodiment are described. Unless otherwise specified, the variations of the present embodiment include the same components as those in the present embodiment described above. Thus, the same elements will be designated by the same signs, and the description thereof will not be repeated. Also in these variations of the present embodiment, the same effect as that of the present embodiment described above can be obtained.

Although CEM-3 has been described as an example material for main substrate 1 and standing substrate 2 in the present embodiment above, other materials may be used for main substrate 1 and standing substrate 2. For example, an FR-4 (Flame Retardant Type 4) base material formed by impregnating a glass fiber cloth with an epoxy resin, a paper phenol substrate formed by impregnating a paper insulator with a phenol resin, a ceramic substrate formed by simultaneously firing a wiring conductor and a ceramic base material, or the like may be used. In addition, substrates made of different materials may be combined such that, for example, CEM-3 is used as the material for standing substrate 2 and FR-4 is used as the material for main substrate 1.

Although slit 11 in main substrate 1 is provided by press working using a metal mold in the present embodiment described above, slit 11 may be provided by cutting using a drill or a router.

Second Embodiment

Unless otherwise specified, a second embodiment of the present invention includes the same components as those in the first embodiment of the present invention described above. Thus, the same elements will be designated by the same signs, and the description thereof will not be repeated.

A configuration of printed wiring board 10 in the second embodiment of the present invention is described with reference to FIGS. 10 to 12.

Figure 10:
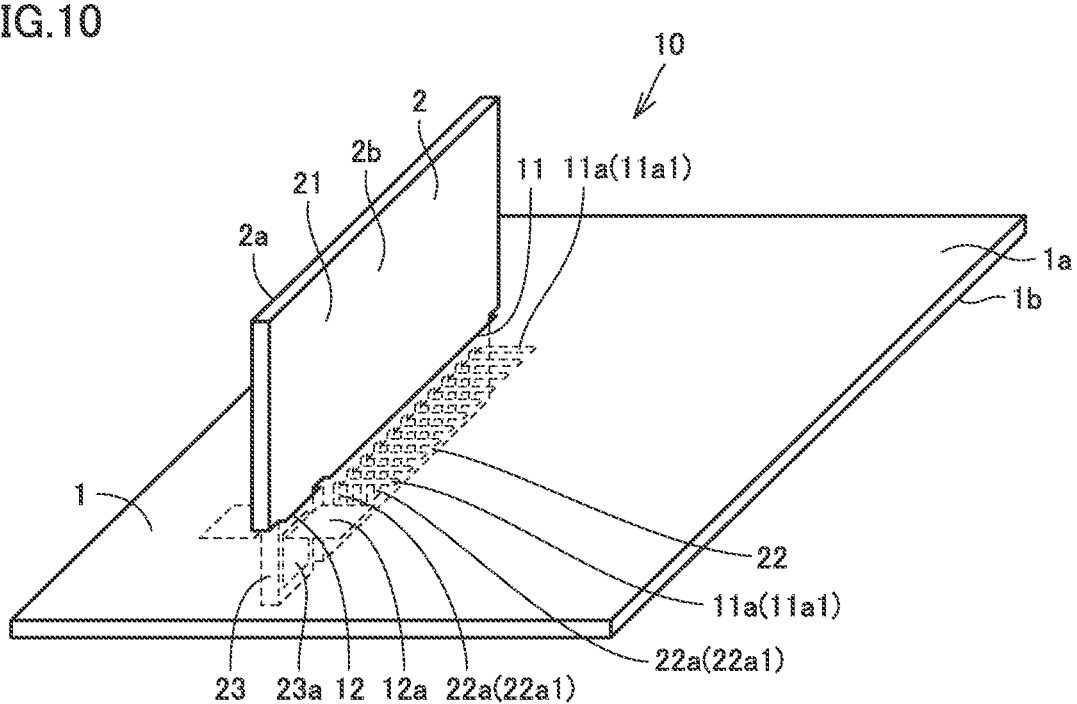
FIG. 10 is a perspective view schematically showing the configuration in which the standing substrate has been mounted on the main substrate in a second embodiment of the present invention.
Figure 11:
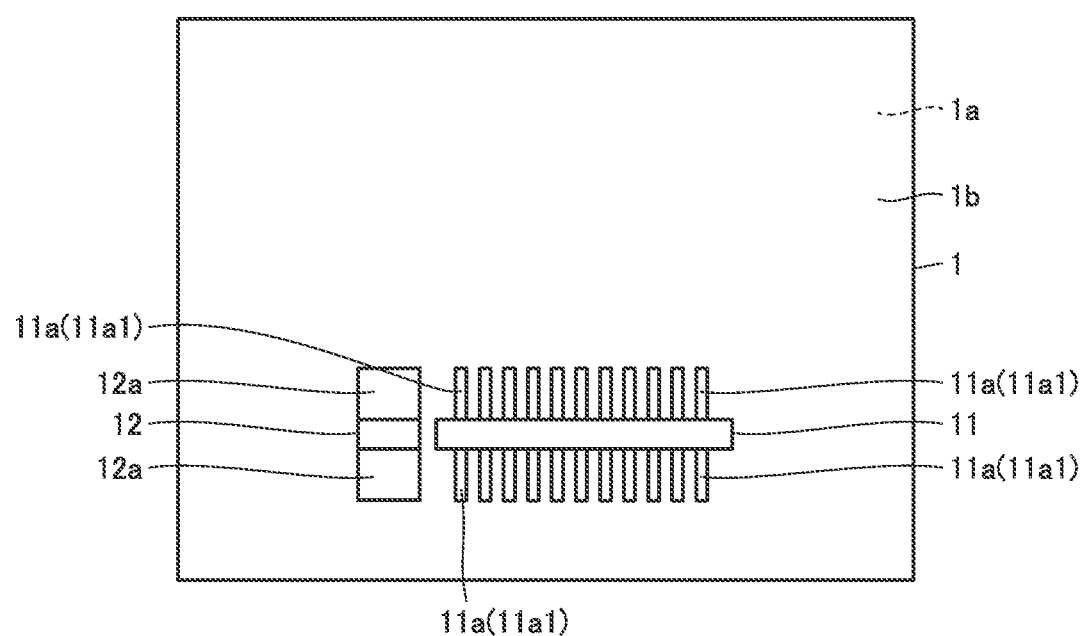
FIG. 11 is a bottom view schematically showing the configuration of the main substrate in the second embodiment of the present invention.

As shown in FIGS. 10 and 11, main substrate 1 has a first auxiliary slit 12. First auxiliary slit 12 extends from top surface 1a to bottom surface 1b of main substrate 1 in the direction in which top surface 1a and bottom surface 1b face each other. First auxiliary slit 12 is separated from slit 11. First auxiliary slit 12 is arranged to be aligned with slit 11. Specifically, first auxiliary slit 12 is arranged to be linearly aligned with slit 11 in the longitudinal direction of slit 11. First auxiliary slit 12 is arranged on one side of slit 11. First auxiliary slit 12 is provided at a position corresponding to a first auxiliary support portion 23 to be described later.

Each of two first auxiliary main electrodes 12a is provided on bottom surface 1b of main substrate 1. Two first auxiliary main electrodes 12a are arranged with first auxiliary slit 12 interposed therebetween in a short direction of first auxiliary slit 12. Each of two first auxiliary main electrodes 12a may be provided to reach first auxiliary slit 12.

Figure 12:
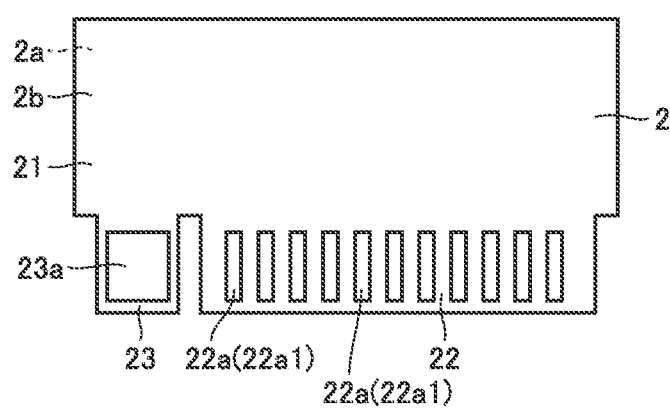
FIG. 12 is a front view schematically showing the configuration of the standing substrate in the second embodiment of the present invention.

As shown in FIGS. 10 and 12, standing substrate 2 has first auxiliary support portion 23. First auxiliary support portion 23 is separated from support portion 22. First auxiliary support portion 23 is arranged to be aligned with support portion 22. Specifically, first auxiliary support portion 23 is arranged to be linearly aligned with support portion 22 in the longitudinal direction of slit 11. First auxiliary support portion 23 is provided at the lower portion of standing substrate 2 so as to protrude downward from body portion 21. Two first auxiliary sub-electrodes 23a are provided on first auxiliary support portion 23. Two first auxiliary sub-electrodes 23a are provided on both front surface 2a and rear surface 2b of standing substrate 2.

Each of two first auxiliary sub-electrodes 23a may be disposed to span from bottom surface 1b of main substrate 1 to the height position higher than or equal to midpoint CL between top surface 1a and bottom surface 1b. First auxiliary main electrode 12a is greater in surface area than each of the plurality of first electrodes 11a1. First auxiliary sub-electrode 23a is greater in surface area than each of the plurality of second electrodes 22a1.

First auxiliary support portion 23 is inserted in first auxiliary slit 12. In this state, each of two first auxiliary sub-electrodes 23a is soldered to each of two first auxiliary main electrodes 12a. In the longitudinal direction of slit 11, slit 11 is greater in dimension than first auxiliary slit 12. In the longitudinal direction of slit 11, support portion 22 is greater in dimension than first auxiliary support portion 23. In the direction in which slit 11 and first auxiliary slit 12 are arranged to be aligned with each other, support portion 22 is greater in length than first auxiliary support portion 23, and slit 11 is greater in length than first auxiliary slit 12. In the direction in which slit 11 and first auxiliary slit 12 are arranged to be aligned with each other, support portion 22 is greater in length than first auxiliary slit 12.

Next, a method for manufacturing the printed wiring board in the present embodiment is described with reference to FIG. 10.

As shown in FIG. 10, support portion 22 and first auxiliary support portion 23 are vertically inserted in slit 11 and first auxiliary slit 12, respectively. In this state, first electrode portion 11a is soldered to second electrode portion 22a, and first auxiliary main electrodes 12a are soldered to first auxiliary sub-electrodes 23a. As a result, first electrode portion 11a is electrically connected to second electrode portion 22a, and first auxiliary main electrodes 12a are electrically connected to first auxiliary sub-electrodes 23a.

Specifically, first electrode portion 11a and second electrode portion 22a are soldered to each other, and first auxiliary main electrodes 12a and first auxiliary sub-electrodes 23a are soldered to each other, by a flow soldering process. That is, the electrodes of main substrate 1 and standing substrate 2 transferred by the conveyor while standing substrate 2 is attached to main substrate 1 are immersed in the molten solder jet stream and soldered. As a result, first electrode portion 11a and second electrode portion 22a are soldered and fixed to each other, and first auxiliary main electrodes 12a and first auxiliary sub-electrodes 23a are soldered and fixed to each other.

Next, the function and effect of the present embodiment are described.

Also in the present embodiment, the same effect as that of the first embodiment described above can be obtained.

In printed wiring board 10 in the present embodiment, in the direction in which slit 11 and first auxiliary slit 12 are arranged to be aligned with each other, support portion 22 is greater in length than first auxiliary support portion 23, and slit 11 is greater in length than first auxiliary slit 12. Thus, during the insertion of standing substrate 2 in main substrate 1, incorrect assembly in which support portion 22 and first auxiliary support portion 23 are inserted in first auxiliary slit 12 and slit 11 in a reverse manner can be suppressed. Therefore, printed wiring board 10 having better workability and further improved quality can be obtained.

Third Embodiment

Unless otherwise specified, a third embodiment of the present invention includes the same components as those in the first and second embodiments of the present invention described above. Thus, the same elements will be designated by the same signs, and the description thereof will not be repeated.

A configuration of printed wiring board 10 in the third embodiment of the present invention is described with reference to FIGS. 13 to 15.

Figure 13:
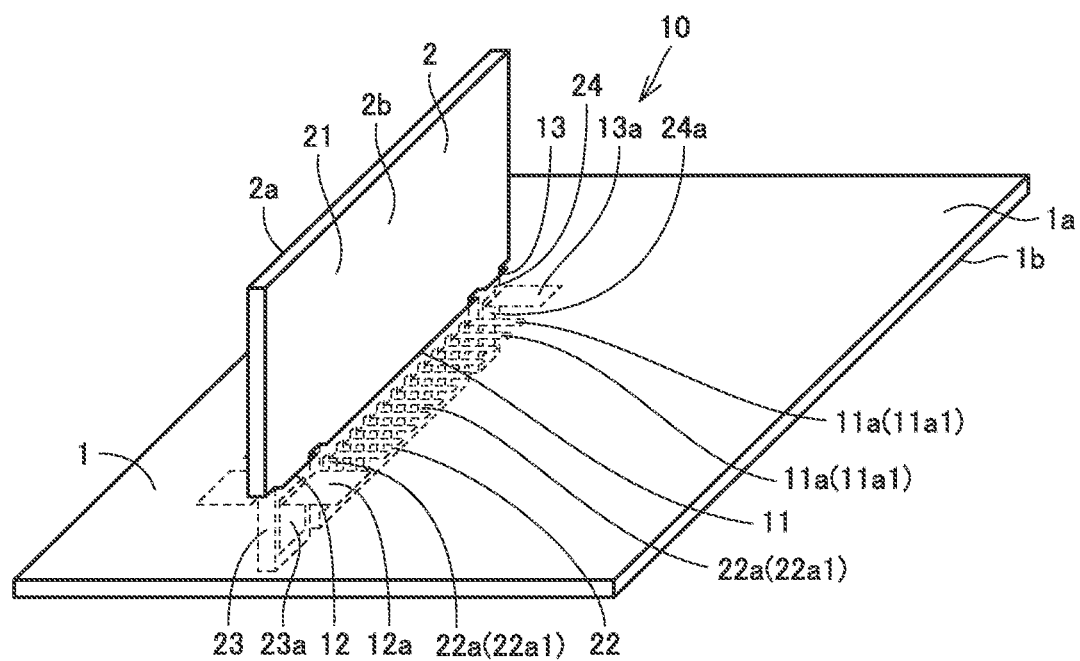
FIG. 13 is a perspective view schematically showing the configuration in which the standing substrate has been mounted on the main substrate in a third embodiment of the present invention.
Figure 14:
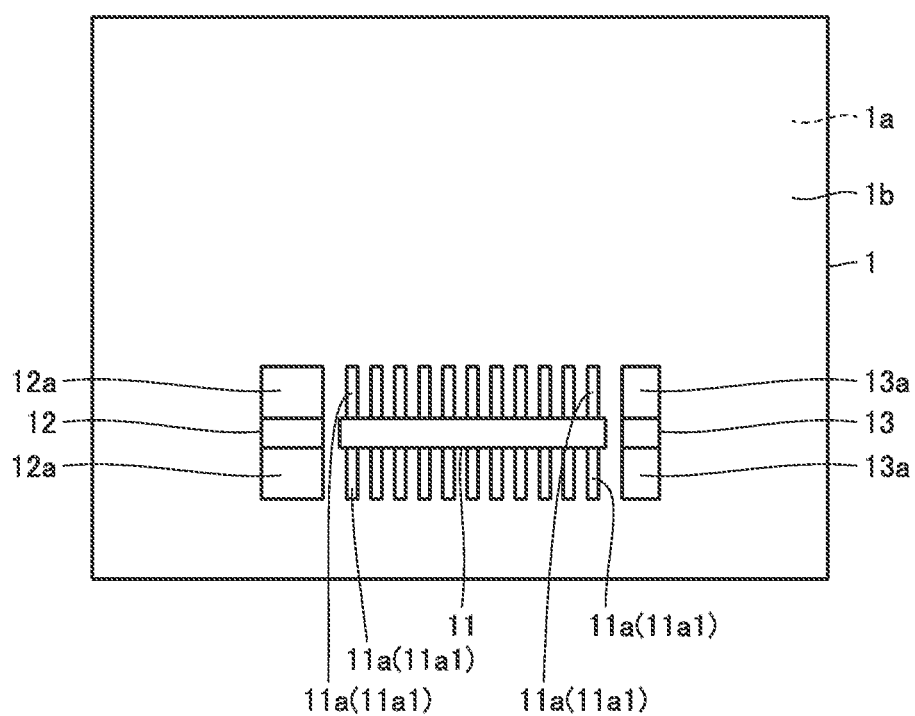
FIG. 14 is a bottom view schematically showing the configuration of the main substrate in the third embodiment of the present invention.

As shown in FIGS. 13 and 14, main substrate 1 has a second auxiliary slit 13. Second auxiliary slit 13 extends from top surface 1a to bottom surface 1b of main substrate 1 in the direction in which top surface 1a and bottom surface 1b face each other. Second auxiliary slit 13 is separated from each of slit 11 and first auxiliary slit 12.

Second auxiliary slit 13 is arranged to be aligned with slit 11 and first auxiliary slit 12. Specifically, second auxiliary slit 13 is arranged to be linearly aligned with slit 11 and first auxiliary slit 12 in the longitudinal direction of slit 11. First auxiliary slit 12 and second auxiliary slit 13 are arranged on both sides of slit 11. That is, second auxiliary slit 13 is arranged such that slit 11 is interposed between first auxiliary slit 12 and second auxiliary slit 13. Second auxiliary slit 13 is provided at a position corresponding to a second auxiliary support portion 24 to be described later.

Two second auxiliary main electrodes 13a are provided on bottom surface 1b of main substrate 1. Two second auxiliary main electrodes 13a are arranged with second auxiliary slit 13 interposed therebetween in a short direction of second auxiliary slit 13. Each of two second auxiliary main electrodes 13a may be provided to reach second auxiliary slit 13. First auxiliary main electrodes 12a and second auxiliary main electrodes 13a are arranged such that first electrode portion 11a is interposed therebetween.

Figure 15:
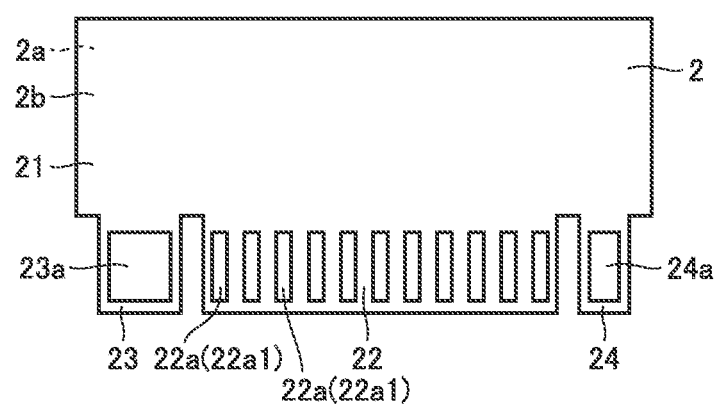
FIG. 15 is a front view schematically showing the configuration of the standing substrate in the third embodiment of the present invention.

As shown in FIGS. 13 and 15, standing substrate 2 has second auxiliary support portion 24. Second auxiliary support portion 24 is provided at the lower portion of standing substrate 2 so as to protrude downward from body portion 21. Second auxiliary support portion 24 is separated from support portion 22. Second auxiliary support portion 24 is arranged to be aligned with support portion 22 and first auxiliary support portion 23. Specifically, second auxiliary support portion 24 is arranged to be linearly aligned with support portion 22 and first auxiliary support portion 23 in the longitudinal direction of slit 11. First auxiliary support portion 23 and second auxiliary support portion 24 are arranged on both sides of support portion 22. That is, second auxiliary support portion 24 is arranged such that support portion 22 is interposed between first auxiliary support portion 23 and second auxiliary support portion 24.

Each of two first auxiliary sub-electrodes 23a is provided on first auxiliary support portion 23. Two first auxiliary sub-electrodes 23a are provided on both front surface 2a and rear surface 2b of standing substrate 2. First auxiliary support portion 23 is inserted in first auxiliary slit 12. First auxiliary sub-electrodes 23a are connected to first auxiliary main electrodes 12a with solder while first auxiliary support portion 23 is inserted in first auxiliary slit 12.

Each of two second auxiliary sub-electrodes 24a is provided on second auxiliary support portion 24. Two second auxiliary sub-electrodes 24a are provided on both front surface 2a and rear surface 2b of standing substrate 2. Second auxiliary support portion 24 is inserted in second auxiliary slit 13. Second auxiliary sub-electrodes 24a are connected to second auxiliary main electrodes 13a with solder while second auxiliary support portion 24 is inserted in second auxiliary slit 13.

Each of two first auxiliary sub-electrodes 23a may be disposed to span from bottom surface 1b of main substrate 1 to the height position higher than or equal to midpoint CL between top surface 1a and bottom surface 1b. Each of two second auxiliary sub-electrodes 24a may be disposed to span from bottom surface 1b of main substrate 1 to the height position higher than or equal to midpoint CL between top surface 1a and bottom surface 1b.

Each of the plurality of second electrodes 22a1 is connected to each of the plurality of first electrodes 11a1 with solder. Each of two first auxiliary main electrodes 12a is greater in surface area than each of the plurality of first electrodes 11a1. Each of two first auxiliary sub-electrodes 23a is greater in surface area than each of the plurality of second electrodes 22a1. Each of two second auxiliary main electrodes 13a is greater in surface area than each of the plurality of first electrodes 11a1. Each of two second auxiliary sub-electrodes 24a is greater in surface area than each of the plurality of second electrodes 22a1. Each of two first auxiliary main electrodes 12a is greater in surface area than each of two second auxiliary main electrodes 13a. Each of two first auxiliary sub-electrodes 23a is greater in surface area than each of two second auxiliary sub-electrodes 24a.

In the longitudinal direction of slit 11, support portion 22 is greater in dimension than each of first auxiliary support portion 23 and second auxiliary support portion 24. In the longitudinal direction of slit 11, slit 11 is greater in dimension than each of first auxiliary slit 12 and second auxiliary slit 13. In the longitudinal direction of slit 11, first auxiliary support portion 23 is greater in dimension than second auxiliary support portion 24. In the longitudinal direction of slit 11, first auxiliary slit 12 is greater in dimension than second auxiliary slit 13.

Next, a method for manufacturing the printed wiring board in the present embodiment is described with reference to FIG. 13.

As shown in FIG. 13, support portion 22, first auxiliary support portion 23 and second auxiliary support portion 24 are vertically inserted in slit 11, first auxiliary slit 12 and second auxiliary slit 13, respectively. In this state, first electrode portion 11a and second electrode portion 22a are soldered to each other, first auxiliary main electrodes 12a and first auxiliary sub-electrodes 23a are soldered to each other, and second auxiliary main electrodes 13a and second auxiliary sub-electrodes 24a are soldered to each other. As a result, first electrode portion 11a is electrically connected to second electrode portion 22a, first auxiliary main electrodes 12a are electrically connected to first auxiliary sub-electrodes 23a, and second auxiliary main electrodes 13a are electrically connected to second auxiliary sub-electrodes 24a.

Specifically, first electrode portion 11a and second electrode portion 22a are soldered to each other, first auxiliary main electrodes 12a and first auxiliary sub-electrodes 23a are soldered to each other, and second auxiliary main electrodes 13a and second auxiliary sub-electrodes 24a are soldered to each other, by a flow soldering process. That is, the electrodes of main substrate 1 and standing substrate 2 transferred by the conveyor while standing substrate 2 is attached to main substrate 1 are immersed in the molten solder jet stream and soldered. As a result, first electrode portion 11a and second electrode portion 22a are soldered and fixed to each other, first auxiliary main electrodes 12a and first auxiliary sub-electrodes 23a are soldered and fixed to each other, and second auxiliary main electrodes 13a and second auxiliary sub-electrodes 24a are soldered and fixed to each other.

Next, the function and effect of the present embodiment are described.

Also in the present embodiment, the same effect as that of the first embodiment described above can be obtained.

In printed wiring board 10 in the present embodiment, each of first auxiliary main electrode 12a and second auxiliary main electrode 13a is greater in surface area than each of the plurality of first electrodes 11a1. Each of first auxiliary sub-electrode 23a and second auxiliary sub-electrode 24a is greater in surface area than each of the plurality of second electrodes 22a1. Thus, a solder joint portion is formed between first auxiliary main electrodes 12a and first auxiliary sub-electrodes 23a, between second auxiliary main electrodes 13a and second auxiliary sub-electrodes 24a, and between the plurality of first electrodes 11a1 and the plurality of second electrodes 22a1. Therefore, the amount of solder for the solder joint portions can be increased to thereby increase the joint strength.

In addition, first auxiliary main electrodes 12a and second auxiliary main electrodes 13a of main substrate 1, and first auxiliary sub-electrodes 23a and second auxiliary sub-electrodes 24a of standing substrate 2 are provided on both ends of an electrode formation region that are subjected to the highest thermal strain. Thus, the electrodes can be increased in surface area on both ends of the electrode formation region that are subjected to the highest thermal strain, to thereby reduce the thermal strain caused by the difference in coefficient of linear expansion between main substrate 1 and standing substrate 2. Therefore, the life of all solder joint portions including first electrode portion 11a and second electrode portion 22a can be prolonged. Thus, printed wiring board 10 with further improved reliability can be obtained.

In addition, unfavorable misalignment between first electrode portion 11a of main substrate 1 and second electrode portion 22a of standing substrate 2 can be prevented by an improved self-alignment effect obtained by enlarging first auxiliary main electrodes 12a and second auxiliary main electrodes 13a of main substrate 1, and first auxiliary sub-electrodes 23a and second auxiliary sub-electrodes 24a of standing substrate 2. Therefore, printed wiring board 10 with improved quality can be obtained. The self-alignment effect refers to a function in which misalignment of an electronic component mounted on an electrode is corrected by the surface tension of molten solder on the electrode. The larger the electrode, the higher the surface tension, and thus the higher the self-alignment effect.

Fourth Embodiment

Unless otherwise specified, a fourth embodiment of the present invention includes the same components as those in the first to third embodiments of the present invention described above. Thus, the same elements will be designated by the same signs, and the description thereof will not be repeated.

A configuration of printed wiring board 10 in the fourth embodiment of the present invention is described with reference to FIG. 16.

Figure 16:
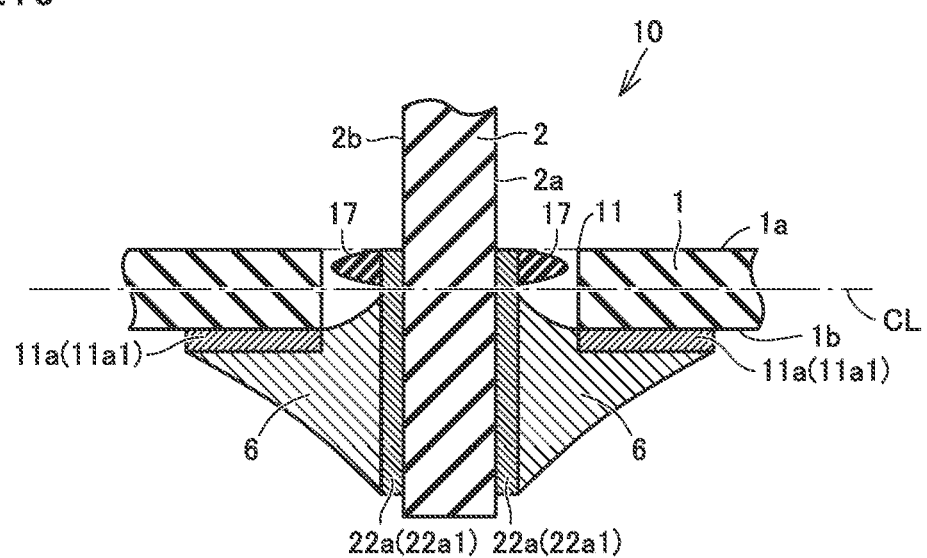
FIG. 16 is a cross-sectional view schematically showing the configuration of the standing substrate in a fourth embodiment of the present invention.

FIG. 16 is a cross-sectional view of a main electrode portion after standing substrate 2 has been vertically inserted in main substrate 1, and main substrate 1 and standing substrate 2 have been soldered to each other. Support portion 22 of standing substrate 2 is vertically inserted in slit 11 in main substrate 1, and main substrate 1 and standing substrate 2 are soldered to each other. The soldering causes a fillet of solder 6 to be formed between the plurality of first electrodes 11a1 of first electrode portion 11a of main substrate 1 and the plurality of second electrodes 22a1 of second electrode portion 22a of standing substrate 2, to fix main substrate 1 and standing substrate 2 to each other. In order to hold standing substrate 2 at the center position of slit 11 until soldering is completed after the insertion of standing substrate 2, an insulating raised resin portion 17 is provided at positions where slit 11 in main substrate 1 intersects the plurality of second electrodes 22a1 of second electrode portion 22a of standing substrate 2. Raised resin portion 17 is provided on the plurality of second electrodes 22a1 of second electrode portion 22a. Raised resin portion 17 is provided at one or more locations. The locations of raised resin portion 17 before the insertion may have a thickness greater than the width of slit 11. Raised resin portion 17 is provided during, before or after a step of mounting the components on standing substrate 2, by a step of applying a resin with a dispenser or the like, and drying the resin. The resin has a coefficient of linear expansion, after being cured, lower than or equal to the coefficient of linear expansion of the solder, for example, lower than or equal to 20 ($10^{-6}$/° C.).

Even if the thickness of standing substrate 2 varies negatively, and the machining of slit 11 in main substrate 1 varies positively, standing substrate 2 can be held at the center position of slit 11. Thus, an inter-electrode clearance between second electrode 22a1 of second electrode portion 22a of standing substrate 2 and first electrode 11a1 of first electrode portion 11a of main substrate 1 can be reduced to 50% of a maximum variation. Accordingly, the soldering can be performed more conveniently, leading to an effect of improving the quality. Conversely, when the thickness of standing substrate 2 varies positively, and the machining of slit 11 in main substrate 1 varies negatively, raised resin portion 17 comes into contact with slit 11 in main substrate 1. However, since second electrode 22a1 of second electrode portion 22a of standing substrate 2 does not come into contact with a wall surface of slit 11 in main substrate 1, the insertability during the attachment of standing substrate 2 to main substrate 1 is not reduced. Reduction in solderability and reliability due to soil and damage to second electrode 22a1 of second electrode portion 22a of standing substrate 2 can also be avoided, leading to an effect of improving the quality. Further, at the time of manufacturing, an assembly of main substrate 1 and standing substrate 2 can be flown, without change, into the solder bath without using large-scale jigs and the like for vertically holding the standing substrate with respect to main substrate 1. This can lead to effects of assisting the simplification of the manufacturing process, the reduction of cost, and the like.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1 main substrate; 2 standing substrate; 10 printed wiring board; 11 slit; 11a first electrode portion; 11a1 first electrode; 12 first auxiliary slit; 12a first auxiliary main electrode; 13 second auxiliary slit; 13a second auxiliary main electrode; 17 raised resin portion; 21 body portion; 22 support portion; 22a second electrode portion; 22a1 second electrode; 23 first auxiliary support portion; 23a first auxiliary sub-electrode; 24 second auxiliary support portion; CL midpoint.

The invention claimed is:

1. A printed wiring board comprising:
a main substrate having a top surface and a bottom surface facing the top surface, the main substrate having a slit extending from the top surface to the bottom surface in a direction in which the top surface and the bottom surface face each other;
a first electrode portion provided on the bottom surface of the main substrate;
a standing substrate having a support portion inserted in the slit; and
a second electrode portion provided on both surfaces of the support portion of the standing substrate,
the second electrode portion being connected to the first electrode portion with solder while the support portion is inserted in the slit,
the first electrode portion being provided to reach the slit,
the second electrode portion being disposed to span from the bottom surface to a height position higher than or equal to a midpoint between the top surface and the bottom surface, and
both surfaces of the support portion being arranged in the slit to be spaced from ends of the slit, with a distance of the space being more than or equal to 50 μm and less than or equal to 190 μm.

2. The printed wiring board according to claim 1, wherein the first electrode portion and an entirety of the second electrode portion exposed at the slit are covered with the solder, the solder continues to a fillet on the second electrode portion in the slit, and a slit-side end surface of each of a plurality of first electrodes is covered with solder.

3. The printed wiring board according to claim 1, wherein the standing substrate has a front surface and a rear surface facing the front surface, and
in a direction in which the front surface and the rear surface face each other, the slit has a width greater than a thickness of the support portion.

4. The printed wiring board according to claim 1, wherein the main substrate has a first auxiliary slit extending from the top surface to the bottom surface in the direction in which the top surface and the bottom surface face each other,
the first auxiliary slit is separated from the slit and arranged to be aligned with the slit, the standing substrate has a first auxiliary support portion separated from the support portion and arranged to be aligned with the support portion, the first auxiliary support portion is inserted in the first auxiliary slit, and in a direction in which the slit and the first auxiliary slit are arranged to be aligned with each other, the support portion is greater in length than the first auxiliary support portion, and the slit is greater in length than the first auxiliary slit.

5. The printed wiring board according to claim 4, wherein the main substrate has a second auxiliary slit extending from the top surface to the bottom surface in the direction in which the top surface and the bottom surface face each other, the second auxiliary slit is separated from the slit and arranged such that the slit is interposed between the first auxiliary slit and the second auxiliary slit, the standing substrate has a second auxiliary support portion separated from the support portion and arranged such that the support portion is interposed between the first auxiliary support portion and the second auxiliary support portion, the second auxiliary support portion is inserted in the second auxiliary slit, the printed wiring board further comprises:

a first auxiliary main electrode and a second auxiliary main electrode provided on the bottom surface of the main substrate and arranged such that the first electrode portion is interposed between the first auxiliary main electrode and the second auxiliary main electrode;

a first auxiliary sub-electrode provided on the first auxiliary support portion; and a second auxiliary sub-electrode provided on the second auxiliary support portion, the first auxiliary sub-electrode is connected to the first auxiliary main electrode with solder while the first auxiliary support portion is inserted in the first auxiliary slit, the second auxiliary sub-electrode is connected to the second auxiliary main electrode with solder while the second auxiliary support portion is inserted in the second auxiliary slit, the first electrode portion includes a plurality of first electrodes, the second electrode portion includes a plurality of second electrodes, each of the plurality of second electrodes is connected to each of the plurality of first electrodes with solder, each of the first auxiliary main electrode and the second auxiliary main electrode is greater in surface area than each of the plurality of first electrodes, and each of the first auxiliary sub-electrode and the second auxiliary sub-electrode is greater in surface area than each of the plurality of second electrodes.

6. The printed wiring board according to claim 1, further comprising a raised resin portion provided at a position where the slit intersects the second electrode portion, wherein the raised resin portion is provided on the second electrode portion.

7. A method for manufacturing a printed wiring board, the method comprising:

preparing a main substrate having a top surface and a bottom surface facing the top surface, the main substrate having a first electrode portion provided on the bottom surface;

forming a slit in such a manner that the first electrode portion is partially cut out, the slit extending from the top surface to the bottom surface of the main substrate;

preparing a standing substrate having a support portion to be inserted in the slit, the standing substrate having a second electrode portion provided on the support portion; and connecting the second electrode portion to the first electrode portion with solder after the support portion of the standing substrate is inserted in the slit, both surfaces of the support portion being arranged in the slit to be spaced from ends of the slit, with a distance of the space being more than or equal to 50 μm and less than or equal to 190 μm.

8. The printed wiring board according to claim 3, wherein the width of the slit has a dimension obtained by adding 0.35 mm to the thickness of the support portion.

* * * * *